(12) United States Patent
Mahulikar et al.

(10) Patent No.: US 6,262,477 B1
(45) Date of Patent: Jul. 17, 2001

(54) BALL GRID ARRAY ELECTRONIC PACKAGE

(75) Inventors: Deepak Mahulikar, Madison, CT (US); Paul R. Hoffman, Modesto; Jeffrey S. Braden, Livermore, both of CA (US)

(73) Assignee: Advanced Interconnect Technologies, Manteca, CA (US)

( * ) Notice: Subject to any disclaimer, the term of this patent is extended or adjusted under 35 U.S.C. 154(b) by 0 days.

(21) Appl. No.: 08/033,596

(22) Filed: Mar. 19, 1993

(51) Int. Cl.[7] .................................................. H01L 23/04
(52) U.S. Cl. ............................ 257/698; 257/786; 257/773
(58) Field of Search ..................................... 257/708, 698, 257/706, 707, 786, 773

(56) References Cited

U.S. PATENT DOCUMENTS

| | | | | |
|---|---|---|---|---|
| 2,905,873 | * | 9/1959 | Ollendorf et al. | 257/708 |
| 4,398,208 | | 8/1983 | Murano et al. . | |
| 4,461,924 | | 7/1984 | Butt . | |
| 4,514,752 | | 4/1985 | Engel et al. . | |
| 4,667,219 | * | 5/1987 | Lee et al. | 257/693 |
| 4,698,663 | | 10/1987 | Sugimoto et al. . | |
| 4,700,473 | | 10/1987 | Freyman et al. . | |
| 4,706,811 | | 11/1987 | Jung et al. . | |
| 4,737,395 | | 4/1988 | Mabuchi et al. . | |
| 4,771,159 | | 9/1988 | O'Leary . | |
| 4,771,537 | | 9/1988 | Pryor et al. . | |
| 4,791,075 | | 12/1988 | Lin . | |
| 4,816,426 | | 3/1989 | Bridges et al. . | |
| 4,821,151 | | 4/1989 | Pryor et al. . | |
| 4,835,598 | | 5/1989 | Higuchi et al. . | |
| 4,845,313 | | 7/1989 | Endoh et al. . | |
| 4,868,638 | | 9/1989 | Hirata et al. . | |
| 4,868,639 | * | 9/1989 | Mugiya et al. | 257/699 |
| 4,926,241 | * | 5/1990 | Carey | 257/698 |
| 4,939,316 | | 7/1990 | Mahulikar et al. . | |
| 4,965,227 | | 10/1990 | Chang et al. . | |
| 4,990,720 | | 2/1991 | Kaufman . | |
| 5,006,922 | * | 4/1991 | McShane et al. | 257/697 |
| 5,045,914 | | 9/1991 | Casto et al. . | |
| 5,046,971 | | 9/1991 | Ruggiero et al. . | |
| 5,065,228 | | 11/1991 | Foster et al. . | |
| 5,065,281 | | 11/1991 | Hernandez et al. . | |
| 5,098,864 | | 3/1992 | Mahulikar . | |
| 5,102,829 | | 4/1992 | Cohn . | |
| 5,108,955 | | 4/1992 | Ishida et al. . | |
| 5,124,884 | | 6/1992 | Yazu et al. . | |
| 5,144,412 | | 9/1992 | Chang et al. . | |
| 5,148,265 | | 9/1992 | Khandros et al. . | |
| 5,148,266 | | 9/1992 | Khandros et al. . | |
| 5,151,771 | | 9/1992 | Hiroi et al. . | |
| 5,153,379 | | 10/1992 | Guzuk et al. . | |
| 5,166,772 | | 11/1992 | Soldner et al. . | |
| 5,189,261 | | 2/1993 | Alexander et al. . | |
| 5,216,278 | | 6/1993 | Lin et al. . | |
| 5,241,133 | | 8/1993 | Mullen, III et al. . | |
| 5,267,684 | * | 12/1993 | Catheline et al. | 257/699 |

FOREIGN PATENT DOCUMENTS

| | | | | |
|---|---|---|---|---|
| 0222390 | * | 6/1988 | (EP) | 257/698 |
| 90 400 134 | | 7/1990 | (EP) . | |
| 61-224344 | * | 10/1986 | (JP) | 257/698 |
| 1-214052 | * | 8/1989 | (JP) | 257/698 |
| 4-33357 | * | 2/1992 | (JP) | 257/699 |

OTHER PUBLICATIONS

"New Package Takes on QFP's" by Julie Houghten, appearing in Advanced Packaging, Winter 1993 at pp. 38–39.

* cited by examiner

*Primary Examiner*—Sheila V. Clark
(74) *Attorney, Agent, or Firm*—Gregory S. Rosenblatt; Wiggin & Dana

(57) ABSTRACT

There is provided a ball grid array package for housing semiconductor devices. The package has a metallic base with conductive vias extending through holes formed in the base. The conductive vias terminate adjacent an exterior surface of the base. A dielectric coating on at least part of the base and through hole walls electrically isolates the metallic base from the package circuitry.

28 Claims, 6 Drawing Sheets

BALL GRID ARRAY ELECTRONIC PACKAGE

FIELD OF THE INVENTION

The invention relates to an electronic package for housing one or more semiconductor devices. More particularly, the invention relates to a surface mount electronic package having a metallic substrate.

BACKGROUND OF THE INVENTION

Microelectronic devices are typically manufactured from a semiconductor material such as silicon, germanium or gallium/arsenide. The semiconductor material is fashioned into a die, a generally rectangular structure having circuitry formed on one surface. Along the periphery of that surface are input/output pads to facilitate electrical interconnection to external components.

The semiconductor device is brittle and requires protection from moisture and mechanical damage. This protection is provided by an electronic package. The electronic package further contains an electrically conductive means to transport electrical signals between the semiconductor device and external circuitry.

One package design which minimizes space requirements and provides a high density of interconnections between the electronic device and external circuitry is the pin grid array package. One pin grid array package has a multi-layer ceramic substrate with conductive circuitry disposed between the layers. The circuitry terminates at conductive pads to which terminal pins are brazed. U.S. Pat. No. 4,821,151 to Pryor et al illustrates a ceramic pin grid array package.

Molded plastic pin grid array packages are disclosed in U.S. Pat. No. 4,816,426 to Bridges et al. A circuit tape has terminal pins electrically interconnected to circuit traces formed on the tape. The assembly is partially encapsulated within a polymer resin.

Metal pin grid array packages are disclosed in U.S. Pat. No. 5,098,864 to Mahulikar. An array of holes is formed through a metallic substrate. Terminal pins pass through the substrate and are electrically isolated from it by a polymer resin. When the metallic substrate is aluminum based, further electrical isolation is by an anodization layer on the surfaces of the substrate.

Pin grid array packages are electrically interconnected to a printed circuit board by insertion of the terminal pins through a matching array of holes formed in a printed circuit board. The holes in the printed circuit board are metallized and electrical interconnection is made within the through holes of the printed circuit board.

Another type of package having a high density of interconnections is a surface mount package. In a surface mount package, the printed circuit board does not require an array of holes. The leads of the package are soldered to bond pads on the printed circuit board. Typically, the leads are either bent under the package in a J-shape or are bent in a gull wing shape and soldered to interconnect pads aligned with the perimeter of the package. This package is disclosed in U.S. Pat. No. 4,706,811 to Jung et al and U.S. Pat. No. 5,065,281 to Hernandez et al. The solder to join the electronic package to the printed circuit board is screened onto the bond pads and may contain fillers such as plated copper spheres to space the package from the board as disclosed in U.S. Pat. No. 4,771,159 to O'Leary.

An advantage of a surface mount package is reduced space requirement on a printed circuit board compared to packages with leads extending from the package body. The interconnection between the surface mount package and a printed circuit board is solder pads located on the surface of the board rather than holes drilled through the board. The number of leads in a typical leaded surface mount package is, however, limited by the peripheral area of the surface mount package.

A limitation with a pin grid array package is the array of holes formed in the printed circuit board must be aligned with the array of terminal pins extending from the package base.

Preferred packages are land grid array packages (electrical interconnection is through metallized pads on the package base) and ball grid array packages (electrical interconnection is through solder bumps formed on the base of the package). The ball grid array package does not require terminal pins and has direct solder bonds between metallized pads on a ceramic base and matching pads on a printed circuit board. Ceramic bases are a relatively poor thermal conductor as are epoxy based laminated printed circuit board bases. Metallic bases would provide an improved land grid array package. However, a means to prevent the solder joints from electrically shorting to the metallic substrate is required. Also, a means to transmit electrical signals from a printed circuit board to an encased electronic device is required.

Applicants have developed a ball grid array package having a metallic substrate which solves these problems.

SUMMARY OF THE INVENTION

Accordingly, it is an object of the invention to provide a ball grid array electronic package having a metallic base. It is the feature of the invention that the metallic base contains a plurality of electrically conductive vias which, in most embodiments, are electrically isolated from the base. One end of the vias is electrically connected to external circuitry while the other end is electrically connected to an integrated circuit device.

Among the advantages of the present invention are the package does not require through holes formed in a system printed circuit board. The package has a finer pitch than a pin grid array package. The ball grid array package requires less peripheral space than a peripherally leaded electronic package. The package has lower lead to lead mutual inductance than leaded packages or leaded surface mount packages as well as lower lead self inductance. The metallic substrate provides enhanced thermal dissipation.

In accordance with the invention, there is provided an electronic package. The electronic package has a metallic base which contains interior and exterior surfaces. A plurality of electrically conductive vias extend through the metallic base with one end terminating approximately at the exterior surface. A first electrically conductive means is bonded to each of the electrically conductive vias adjacent the exterior surface. A second electrically conductive means interconnects the electrically conductive vias to an electronic device mounted on the metallic base. A cover is bonded to the metallic base with the electronic device disposed therebetween.

The above stated objects, features and advantages will become more apparent from the specification and drawings which follow.

IN THE DRAWINGS

DETAILED DESCRIPTION OF THE INVENTION

Figure 1:
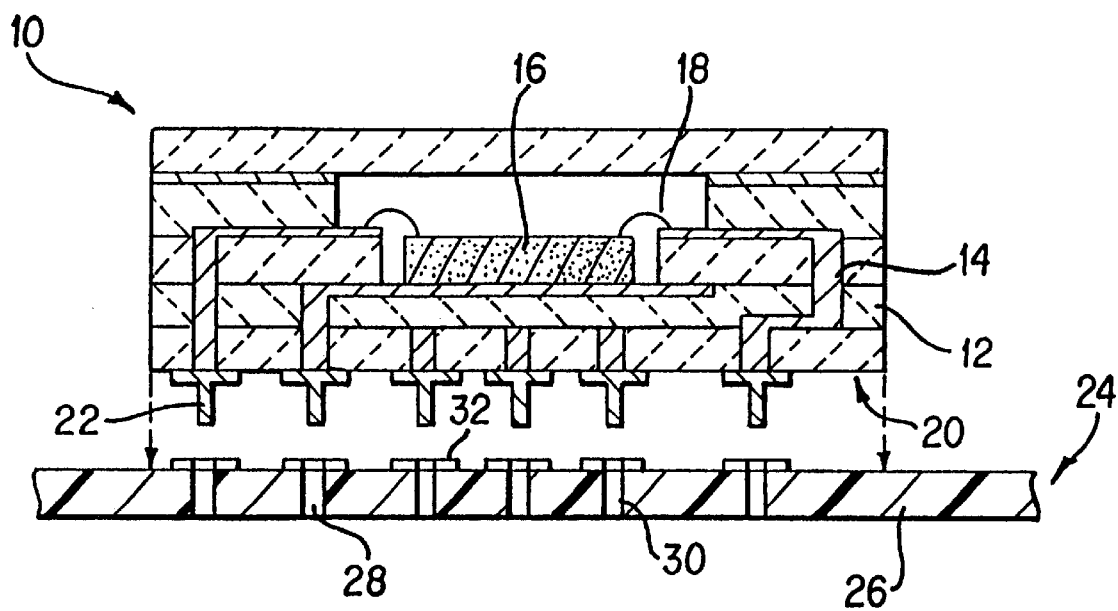
FIG. 1 shows in cross-sectional representation a pin grid array package as known from the prior art.

FIG. 1 shows in cross-sectional representation a pin grid array package 10 as known from the prior art. The package has a multi-layer ceramic base 12 containing internal metallizations 14 for communicating electrical signals from external circuitry to an encapsulated integrated circuit device 16. One end of the internal metallization 14 terminates within the pin grid array package 10 and is electrically interconnected to the integrated circuit device by means of wire bond 18. The opposing end of the internal metallization 14 terminates at an exterior surface 20 of the pin grid array package 10. Terminal pins 22 are electrically interconnected to the internal metallization 14 at the exterior surface 20 such as by soldering. The external circuitry with which the integrated circuit device 16 communicates is generally disposed about a printed circuit board 24, referred to as the system board.

The system board 24 has a substrate 26 formed from a rigid or semi-rigid material such as a glass-filled epoxy. A uniform array of holes 28 having a configuration matching the array of terminal pins 22 of the pin grid array package 10 is formed through the substrate. The surfaces of the holes 28 are metallized. Metallized bond pads 32 may be included on the system board 24 and soldered to the terminal pins 22 to improve the integrity of the bond between the pin grid array package 10 and system board 24.

Figure 2:
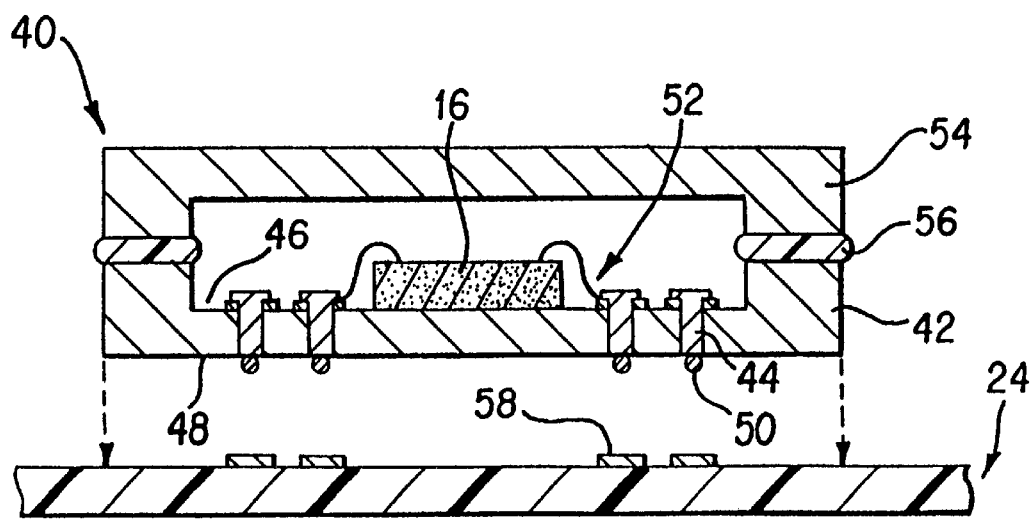
FIG. 2 shows in cross-sectional representation a ball grid array package in accordance with an embodiment of the present invention.

FIG. 2 illustrates in cross-sectional representation a ball grid array package 40 in accordance with the present invention which eliminates the need for machining an array of holes in the system board. Since terminal pin to system board hole alignment is not required, the ball grid array package can be designed with a finer pitch than the pin grid array package. Pitch is the center to center spacing between terminal pins of a pin grid array or bond pads of a ball grid array. The pitch of a pin grid array is on the order of 2.5 mm (100 mils) while the land grid array is capable of 1.25 mm (50 mils) or finer pitch. A further limitation on the pitch of a pin grid array package is the terminal pins must have a large enough diameter to resist bending during insertion.

The ball grid array package does not require external leads. The absence of parallel running external leads reduces mutual lead inductance and lead self inductance, both problems with "gull wing" or "J-wing" surface mount packages as well as with pin grid array packages.

The ball grid array package 40 has a metallic base 42 formed from any material having good thermal conductivity. Preferred metals include copper, aluminum and alloys thereof. Most preferred are aluminum alloys capable of forming an electrically insulating anodization layer.

Electrically conductive vias 44 extend from an interior surface 46 to an exterior surface 48 of the metallic base 42. Unlike a pin grid array package, one end of the electrically conductive via terminates approximately at exterior surface 48. A first electrically conductive means 50, such as a low melting temperature solder or an electrically conductive adhesive or sealing glass, is bonded to the electrically conductive vias 44 adjacent to the exterior surface 48. A second electrically conductive means 52, such as a combination of internal circuitry and bond wires, electrically interconnects the electrically conductive vias 44 to an electronic device 16 mounted on the interior surface 46 of the metallic base 42.

The ball grid array package 40 is completed by bonding a cover 54 to the metallic base 42 with the electronic device 16 disposed there between. The cover 54 may be any suitable material, metal, ceramic or plastic. Preferably, the coefficient of thermal expansion of the cover 54 is approximately equal to the coefficient of thermal expansion of the metallic base 42 to prevent bending of the ball grid array package 40 due to thermal expansion mismatch. The bond 56 between the metallic base 42 and cover 54 may be any suitable material such as a polymer, ceramic or metallic solder. Polymer adhesives, such as thermosetting epoxies, are preferred due to the ease with which an epoxy will bond to an anodized aluminum surface in accordance with preferred embodiments of the invention. Metallic solders, or electrically conductive adhesives, electrically interconnecting the metallic base 42 and a metallic cover 54 are preferred when the integrated circuit device 16 is to be shielded from electromagnetic interference.

The assembled ball grid array package 40 is bonded to bond pads 58 by the first electrically conductive means 50. Typically, the bond pads 58 are metallized pads interconnected to circuitry on the system board 24. The first electrically conductive means may be a low melting temperature solder such as a lead tin alloy.

Figure 3:
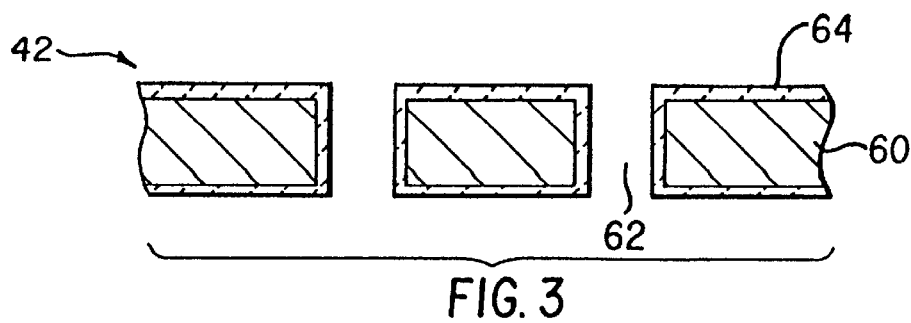
FIG. 3 shows in cross-sectional representation a metallic base utilized in the ball grid array package of the present invention.

FIGS. 3–9 illustrate in cross-sectional representation methods for forming electrically conductive vias in a metallic base. In FIG. 3, the metallic base 42 has a metallic core 60 with a plurality of through holes 62. The through holes 62 may be formed by any conventional means. If the metallic core 60 is a metallic sheet, through holes 62 can be formed by a subtractive technique such as etching, punching, drilling or lasing. If the metallic core is formed by casting or sintering, the metallic core 60 can be formed with preexisting through holes 62. After the through holes 62 are formed, a dielectric layer 64 coats the surfaces of the metallic core 60, including the walls of the through holes 62. When the metallic core is aluminum, suitable methods for forming the dielectric layer 64 include anodization and chromating.

The dielectric layer has a thickness sufficient to prevent current leakage from conductive vias formed in the through holes to the metallic core 60. When the dielectric layer 64 is an anodization layer, a suitable thickness is from about 0.0076 millimeter to about 0.038 millimeter (0.0003–0.0015 inch).

When the metallic core 60 is copper or a copper based alloy, the dielectric layer 64 may be a refractory layer formed in situ, from the alloying constituents of the copper alloy. One suitable copper alloy for in situ formation of the dielectric layer is C638, nominal composition by weight 95% Cu. 2.8% Al, 1.8% Si, 0.4% Co, which on heating in an atmosphere containing a trace of water vapor forms an alumina surface layer as disclosed in U.S. Pat. No. 4,461,924 to Butt. Alternatively, the copper alloy metallic core 60 may be coated with a material capable of forming a dielectric layer, such as vacuum deposited aluminum, which is then made electrically nonconductive by anodization or chromating.

Figure 4:
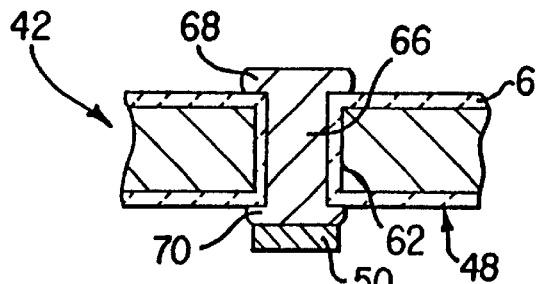
FIGS. 4–9 illustrate in cross-sectional representation the formation of electrically conductive vias to transmit electrical signals from an encased integrated circuit device to external circuitry.

The electrically conductive vias are formed by any suitable method. In FIG. 4, a copper slug 66 having a length slightly longer than the through hole 62 is inserted in the hole and swaged to deform the pin head 68 and terminal end 70, mechanically locking the copper slug in the hole. The terminal end 70 terminates approximately at the exterior end 48 of the metallic base 42. A first electrically conductive means 50 is then bonded to the terminal end.

Any suitable means may be used to adhere the first electrically conductive means 50 to the terminal end 70. When the first electrically conductive means 50 is a solder foil, a tack weld may be used. A drop of liquid solder may be deposited on each terminal end 70. The liquid solder does not wet the dielectric layer 64 so precise location of the solder drop is not required. The molten solder will accumulate over the terminal pin. Applicants believe a solder dip may also be suitable. Solder paste can be deposited by any controlled alignment deposition means such as screen printing or dispensing from a syringe guided by a pattern recognition means. Other solder deposition means include plating onto the terminal pins as well as evaporation or sputtering through a mask.

When the first electrically conductive means 50 is a polymer adhesive or an electrically conductive glass, a partial cure, known in the art as tacking, may be utilized to adhere the components. Liquid polymers and glass pastes may be deposited by any controlled alignment means as described above.

Figure 5:
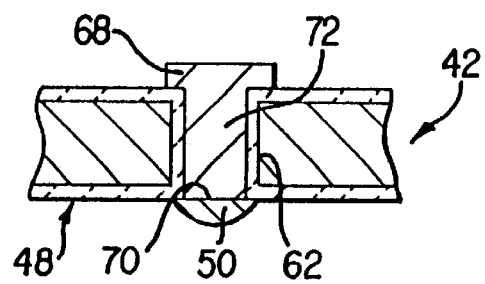

A second method of forming the electrically conductive via is illustrated in FIG. 5. A terminal pin 72 having a pin head 68 with a diameter larger than the diameter of the through hole 62 is inserted through the through hole. The terminal end 70 of the terminal pin 72 terminates approximately at the exterior surface 48 of the metallic base 42. A sufficiently large volume of first electrically conductive means 50 is bonded to the terminal end 70 of the terminal pin 72 such that the first electrically conductive means extends beyond the diameter of the through hole 62, thereby locking the conductive via in place.

Figure 6:
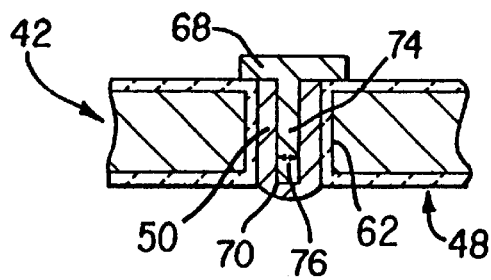

FIG. 6 illustrates another method to form the conductive vias. The terminal pin 74 has a pin head 68 with a diameter larger than the diameter of the through hole 62. The terminal end 70 terminates approximately at the exterior end 48 of the metallic substrate 42. The diameter 76 of the terminal pin 74 is significantly less than the diameter of the through hole 62, typically on the order of from about one third to about one half the diameter of the through hole. The first electrically conductive means 50 is selected to be a fluid material such as molten solder or low viscosity polymer adhesive. Sufficient first electrically conductive means 50 is deposited within the through hole 62 to fully occupy the area of the through hole and extend slightly beyond the exterior surface 48 of the metallic substrate 42.

The embodiment of FIG. 6, as well as other embodiments including headed pins, is equally suited for headless pins which are supported by an internal circuit board by any suitable means such as solder or a press fit.

Figure 7:
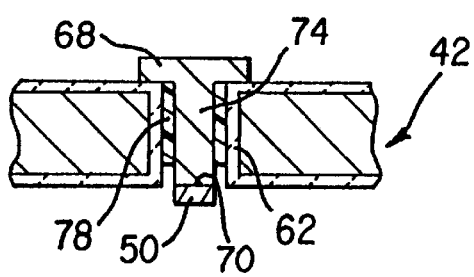

Rather than utilize the first electrically conductive means to bond the electrically conductive via in place, an embodiment as illustrated in FIG. 7 may be utilized. The terminal pin 74 has a pin head 68 with a diameter larger than the diameter of the through hole 62. A dielectric sealing means 78, such as a polymer adhesive or sealing glass, bonds the shank of the terminal pin 74 to the walls of through hole 62 and provides additional electrical isolation between the electrically conductive via and the metallic substrate 42. One suitable sealing glass is disclosed in European Pat. No. 90 400,134.4 to Electronique Serge Dassault and has the molar composition 20–50% sodium oxide, 5–30% barium oxide, 0.5–3% aluminum oxide, 40–60% phosphoric anhydride and up to 7% aluminum nitride. This glass is disclosed to be suitable for bonding an anodized aluminum substrate to a nickel plated copper pin. A first electrically conductive means 50 is then bonded to the terminal end 70 as described above.

Figure 8A:
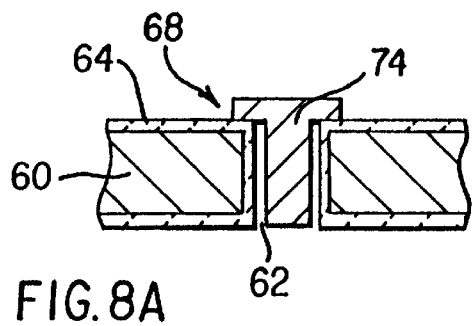
Figure 8B:
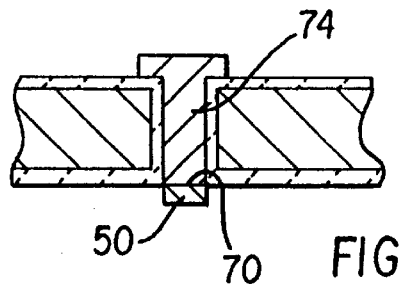

A coefficient of thermal expansion mismatch between a terminal pin and the metallic substrate may be utilized to form electrically conductive vias as illustrated in FIGS. 8A and 8B. In FIG. 8A, a metallic core 60 is coated with a dielectric layer 64. A terminal pin 74 formed from a different metallic material is placed in through hole 62 and supported by pin head 68. The compositions of the metallic core 60 and the terminal pin 74 are selected such that the coefficient of thermal expansion of the metallic core 60 is greater than that of the terminal pin 74. For example, the metallic core 60 can be aluminum or an aluminum based alloy and the terminal pin 74 can be copper or a copper base alloy. Both the metallic core and terminal pin are heated to a temperature sufficiently high to cause both materials to expand appreciably without thermal degradation (such as precipitation hardening or annealing) of either component.

While hot, the terminal pin is inserted in the through hole. When the combination is cooled, the higher coefficient of thermal expansion of the metallic substrate 60 causes the through hole 62 to collapse more than the diameter of the terminal pin 74, forming a tight press fit as illustrated in FIG. 8B. A first electrically conductive means 50 is then bonded to the terminal end 70 of the press fit, terminal pin 74.

Figure 9:
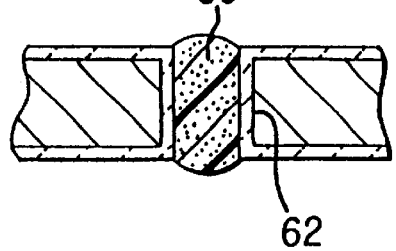

The conductive via need not be a rigid structure. In FIG. 9, an electrically conductive paste 80 is utilized. The electrically conductive paste 80 fills the through hole 62 and when cured, forms an electrically conductive via. Suitable electrically conductive pastes include a solder paste such as a lead tin alloy solder, such as 60% Sn/ 40% Pb, or a silver filled epoxy resin.

Figure 10:
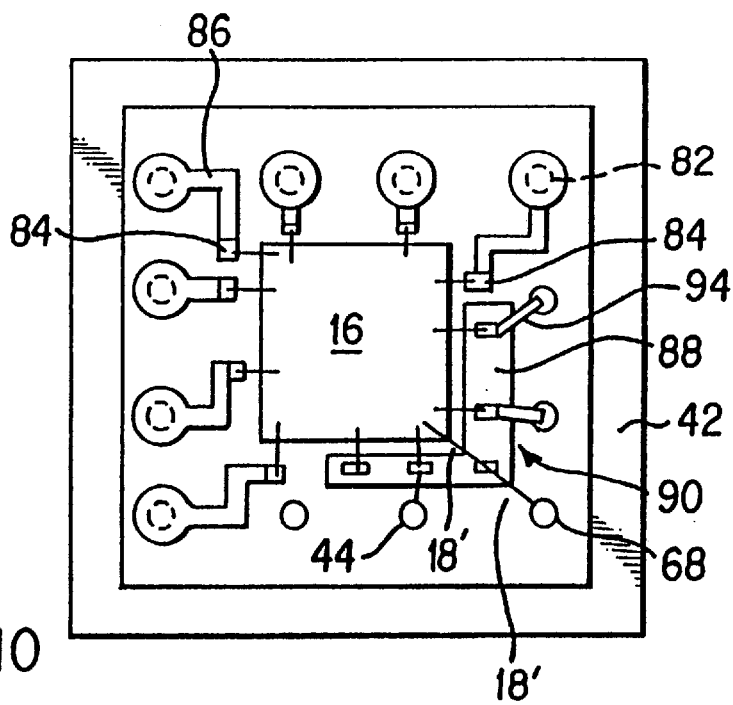
FIG. 10 shows in top planar view means for electrically interconnecting conductive vias to an integrated circuit device.

FIG. 10 illustrates in top planar view means for electrically interconnecting the internal end of the electrically conductive via 44 to an electronic device 16 mounted on the metallic base 44. This second electrically conductive means may be by direct deposition of electrically conductive circuit traces on the dielectric layer or by inclusion of an internal circuit board. The internal circuit board may be flexible (for example, supported on a thin layer of polyimide), rigid (for example, supported by an FR-4 epoxy) or semi-rigid. FIG. 10 illustrates direct deposition methods. An electrically conductive thick film paste 82 may be screened on the dielectric layer and extend from the electrically conductive via to wire bond pads 84 in the vicinity of the integrated circuit device. Wire bonds 18 then complete the second electrically conductive means. One suitable thick film paste is silver powder suspended in an organic binder.

A thin film may be deposited on the dielectric layers by evaporation or sputtering. The thin films may include layers of chromium and copper. Unlike the thick film paste 82 which is deposited subsequent to forming an electrically conductive via, the thin film is generally deposited prior to formation of the electrically conductive via 44.

Alternatively, a portion of an internal circuit board 88, known in the art as an interposer circuit, may be utilized. The interposer circuit 88 includes a dielectric layer 90, typically a polyimide, BT resin or FR4 epoxy, which is glued to the dielectric layer of the metallic base 42. Copper foil circuit traces 92 are formed on the dielectric layer 90 either by electroless deposition followed by electroplating or by subtractive etching of an adhesively bonded copper foil. The second electrically conductive means then includes either first and second wire bonds 18' or a combination of a copper foil 94, such as used in tape automated bonding (TAB), and wire bond 18. Either the bond wire or the TAB foil may be directly bonded to a pin head 68 by thermocompression bonding or soldering.

Figure 11:
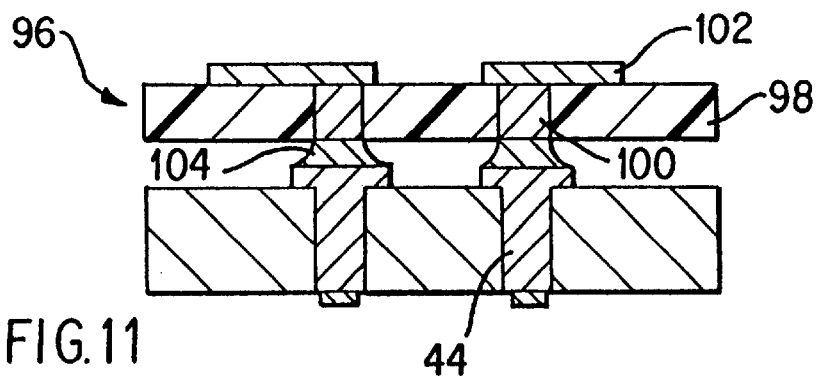
FIGS. 11–14 show in cross-sectional representation means for electrically interconnecting conductive vias and circuitry within the ball grid array package.

FIG. 11 illustrates in cross-sectional representation an internal circuit board 96 for electrical interconnection within the ball grid array package. The internal circuit board 96 has a dielectric layer 98 which may be a rigid material such as a glass filled epoxy or a semi rigid or flexible material such as a polyimide. Electrically conductive vias 100 are formed through the dielectric layer 98 such as by electroless deposition of a thin layer of palladium followed by electrolytic deposition of copper. Alternatively, a thin dispersion of carbon black may be deposited on the walls of through holes and a copper layer deposited on the carbon black dispersion by electrolytic or electroless means as disclosed in U.S. Pat. No. 5,065,228 to Foster et al. Circuit pattern 102 is formed on a first side of the dielectric layer 98 contacting electrically conductive vias 100. The opposing side of the electrically conductive vias 100 is joined to the electrically conductive vias 44 by means of an electrically conductive joint 104 which may be a solder or electrically conductive polymer or glass adhesive.

Figure 12:
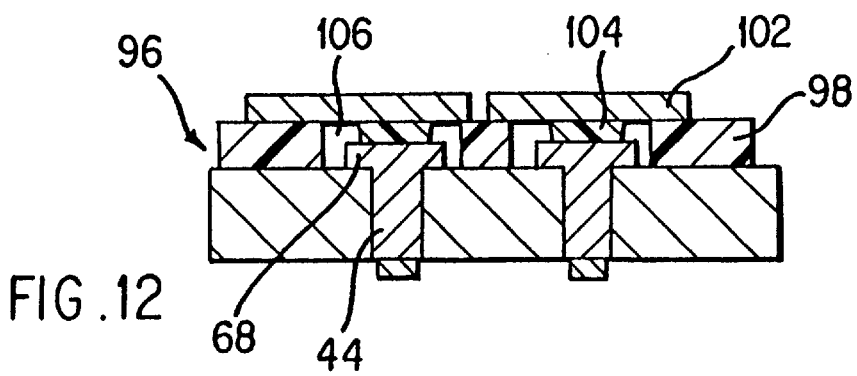

FIG. 12 illustrates in cross-sectional representation an internal circuit board 96 which does not require electrically conductive vias to interconnect the electrically conductive vias 44 to circuit traces 102. Nonconductive vias 106 are formed in the dielectric layer 98. The nonconductive vias 106 have a diameter larger than the pin head 68 of the electrically conductive vias 44. The pin heads extend within the nonconductive vias and are overlayed by circuit traces 102 and an electrically conductive joint 104 electrically bonds the pin head 68 to the circuit trace 102. The electrically conductive joint 104 may be a solder, conductive adhesive, or a direct thermocompression bond between the circuit traces 102 and the pin heads 68.

Figure 13:
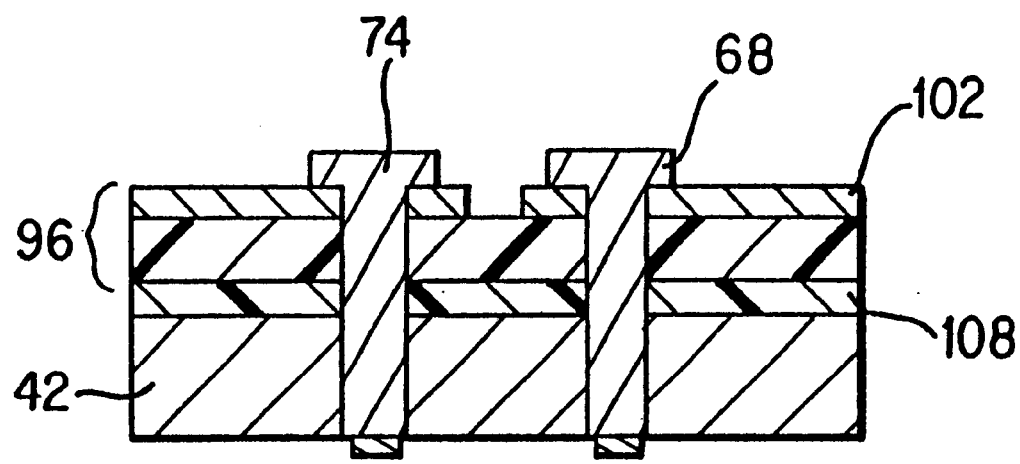

As illustrated in FIG. 13, the terminal pin 74 may extend through both the self supporting circuit 96 and the metallic base 42. The pin head 68 is electrically interconnected to a circuit trace 102 such as by soldering. The internal circuit board 96 is then bonded to the metallic substrate 42 by a dielectric such as an epoxy glue 108.

Figure 14:
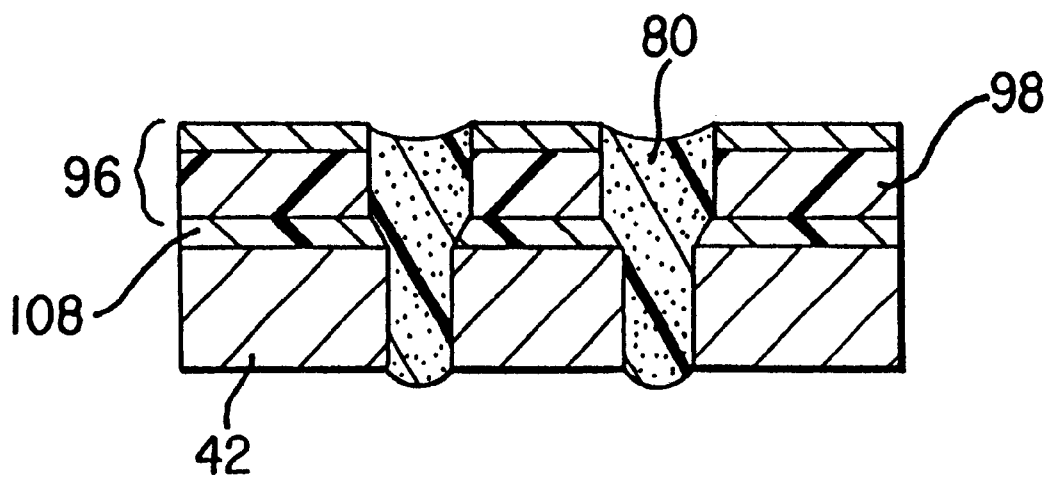

In FIG. 14, the conductive vias are formed by an electrically conductive paste 80. The electrically conductive paste 80 fills a nonconductive via formed through both a metallic base 42 and the internal circuit board 96. A dielectric sealant 108 bonds the dielectric layer 98 of the internal circuit board 96 to the metallic base 42.

Figure 15:
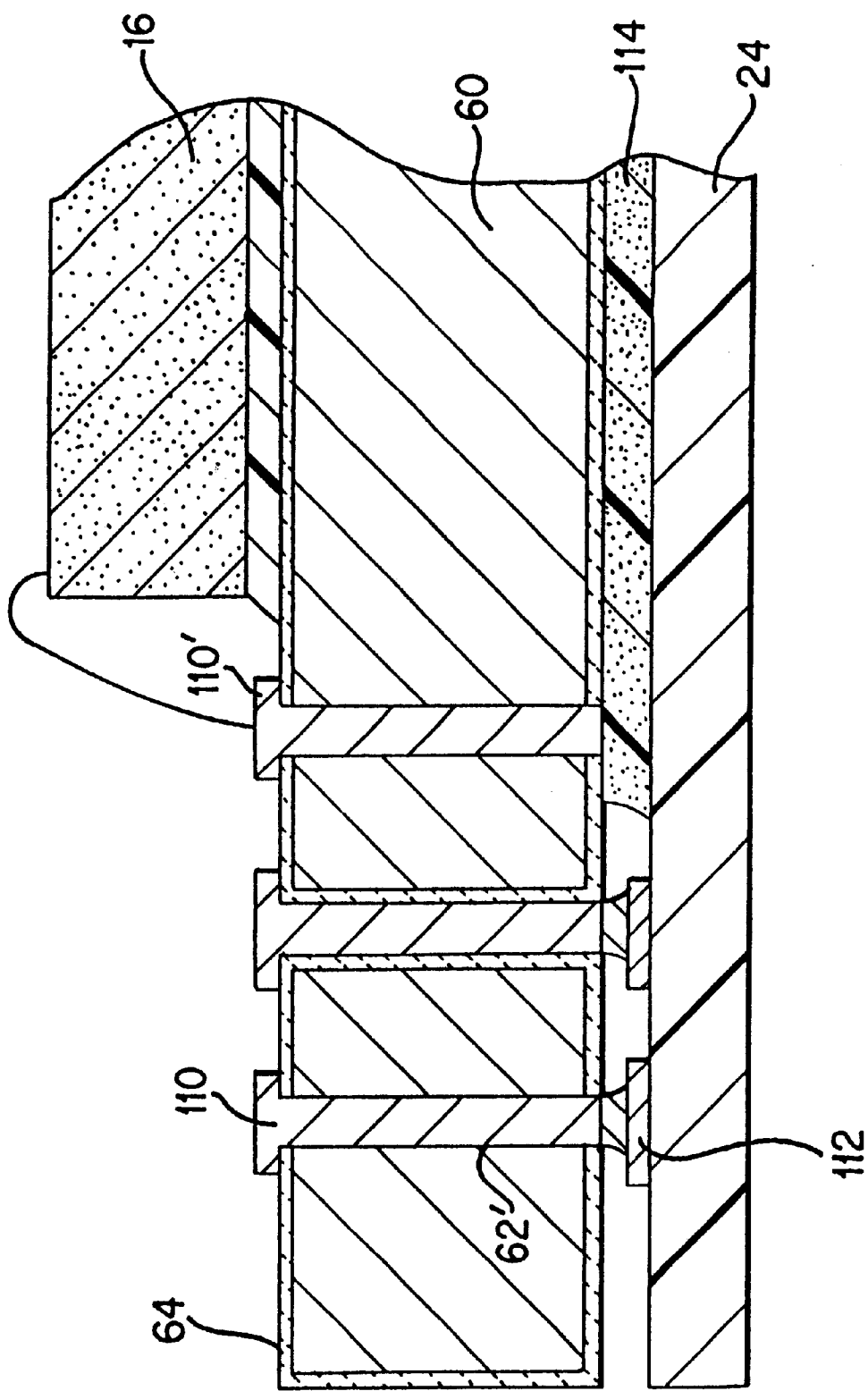
FIG. 15 shows in cross-sectional representation a means for utilizing the metallic bases as a ground plane.

In addition to the improved thermal dissipation achieved through the use of a metallic base, FIG. 15 illustrates another benefit of the metallic core 60. The dielectric layer 64 is removed from select through holes 62'. The dielectric layer free through holes 62' may be formed by mechanically abrading the dielectric layer after formation, such as redrilling the through holes to a slightly larger diameter, or by masking to prevent contact with the anodization or chromating solution. One of the conductive vias 110 is then electrically interconnected to a system board circuit trace 112 which is connected to a ground or power circuit. The entire metallic core 60 is then at the same voltage potential as the ground or power circuit 112. Each conductive via 110' which is electrically interconnected to the metallic core 60 is at the same voltage potential providing power or ground to the integrated circuit device 16. Secondary ground or power plane vias 110' need not contact a system board circuit trace and may be underlied with a thermally conductive grease 114 to improve thermal dissipation from the integrated circuit device 16 to the system board 24.

Figure 16:
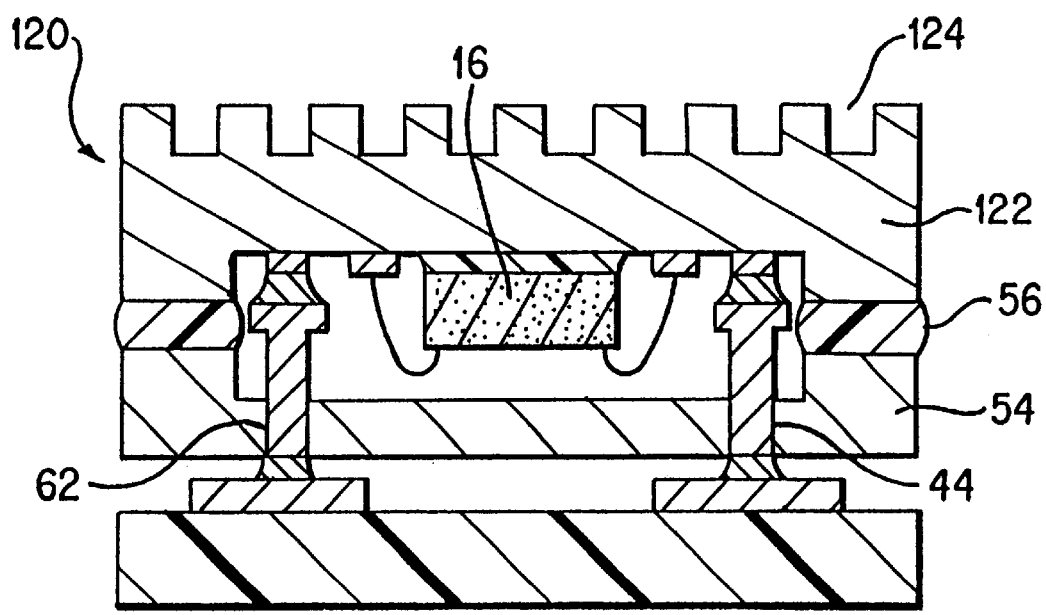
FIG. 16 shows in cross-sectional representation a cavity down ball grid array package having a metallic base and metallic cover.
Figure 17:
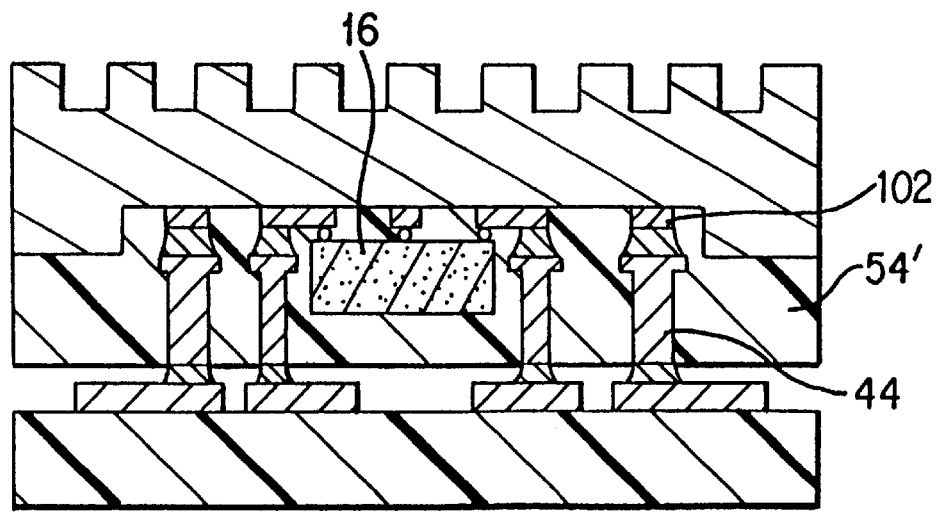
FIG. 17 shows in cross-sectional representation a cavity down ball grid array package having a metallic base and molded resin cover.

In addition to the cavity up ball grid array package illustrated in FIG. 2, a cavity down ball grid array package 120, illustrated in FIGS. 16 and 17, is also within the scope of the invention. The cavity down package 120 is similar to the cavity up package described above, except the electrically conductive vias 44 extend through the cover 54 of the package.

The package base 122, defined as that surface to which the integrated circuit device 16 is adhered, may be formed from any thermally conductive metallic material. Fins 124 may be formed in the base 122 to enhance thermal dissipation. The electrically conductive vias 44 are bonded to circuitry 126 formed on the interior surface 46 of the base component and electrically interconnected to the integrated circuit. The cover component 54 may be formed from any suitable material such as a polymer, ceramic or metal. While it is desirable that the coefficient of thermal expansion of the cover 54 approximately matched that of the base 122, in a preferred embodiment, the cover 54 is formed from a nonconductive material to eliminate the need to coat the walls of the through holes 62 with a dielectric layer. The bond 56 between the base 122 and cover 54 may be any suitable material as described above.

Alternatively, as illustrated in FIG. 17, the cover 54' may be a molding resin such as a thermosetting epoxy which is molded about the electrically conductive vias 44, circuit traces 102 and integrated circuit device 16. Rather than wire bonding, in any configuration of ball grid array packages described above, the integrated circuit device 16 may be electrically interconnected directly to circuit traces 102 by solder bumps, typically referred to as flip chip bonding or C-4 bonding. Other conductive means for flip chip bonding such as conductive adhesives are also applicable.

While the ball grid array packages of the invention have been described in terms of metallic package components, the package designs are suitable for metallic composites and metallic compounds. Suitable metallic composites include copper-tungsten, copper-silicon carbide and aluminum silicon carbide. The metallic composites are manufactured by any means known in the art such as sintering or infiltration. One suitable metallic compound is aluminum nitride. An advantage of the metallic composites and metallic compounds is that the physical characteristics of the material may be specifically designed, for example, to eliminate a coefficient of thermal mismatch between the package and a printed circuit board.

In addition to the metals, metallic composites, and metallic compounds described above, other ball grid array substrates such as epoxy glass, polyimides and ceramics may be utilized in combination with the conductive vias described above.

While the ball grid array packages of the invention have been described in terms of encapsulating a single integrated circuit device, the invention is equally applicable to multi-chip packages and hybrid packages including a printed circuit board with a plurality of electronic devices bonded therein.

The patents and patent application set forth in this specification are intended to be incorporated by reference herein.

It is apparent that there has been provided in accordance with this invention a ball grid array package which fully satisfies the objects, means and advantages set forth hereinbefore. While the invention has been described in combination with specific embodiments thereof, it is evident that many alternatives, modifications and variations would be apparent to those skilled in the art in light of the foregoing description. Accordingly, it is intended to embrace all such alternatives, modifications and variations as fall within the spirit and broad scope of the appended claims.

What is claimed is:

1. An electronic package, comprising:
   a base formed from a metal selected from the group consisting of copper, aluminum and alloys thereof and having interior and exterior surfaces;
   a plurality of electrically conductive vias extending through said metallic base and terminating approximately at said exterior surface, said electrically conductive vias adapted to receive a first electrically conductive means selected from the group consisting of solders, conductive polymers and conductive sealing glasses adjacent said exterior surface;
   a second electrically conductive means selected from the group consisting of thick films, thin films, internal circuit boards, wire bonds and metallic foils interconnecting said electrically conductive vias to an electronic device mounted on said base; and
   a cover bonded to said base with said electronic device disposed therebetween.

2. The electronic package of claim 3 wherein said base is an aluminum based alloy at least partially coated with an anodization layer.

3. The electronic package of claim 2 wherein the thickness of said anodization layer is from about 0.0076 mm to about 0.038 mm.

4. The electronic package of claim 1 wherein said base is a copper based alloy at least partially coated with an in situ refractory oxide layer.

5. The electronic package of claim 1 wherein said base is a copper based alloy at least partially coated with a second metal capable of forming a dielectric layer.

6. The electronic package of claim 5 wherein said second metal is aluminum and said dielectric layer is an anodization layer.

7. The electronic package of claim 2 wherein said base includes a plurality of through holes and said electrically conductive vias are metallic pins extending through said through holes.

8. The electronic package of claim 7 wherein said anodization layer coats the walls of at least some of said through holes.

9. The electronic package of claim 8 wherein said metallic pins are formed from copper or a copper based alloy.

10. The electronic package of claim 9 wherein said metallic pin has a Pin head end and an opposing terminal end with said metallic pin having a diameter smaller than the diameter of said through hole and said pin head end and said terminal end both having a diameter larger than the diameter of said through hole.

11. The electronic package of claim 9 wherein said metallic pin has a pin head at one end, said pin head having a diameter larger than the diameter of said through hole, said metallic pin having at an opposing end a coating of said first electrically conductive means.

12. The electronic package of claim 9 wherein said first electrically conductive means extends within said through hole.

13. The electronic package of claim 9 wherein a dielectric sealant bonds the shank of said metallic pin to said through hole.

14. The electronic package of claim 13 wherein said dielectric sealant is selected from the group consisting of polymer adhesives and sealing glasses.

15. The electronic package of claim 2 wherein said base includes a plurality of through holes and said electrically conductive vias are a conductive paste extending through said through holes.

16. The electronic package of claim 15 wherein said electrically conductive paste is selected from the group consisting of solders and polymers.

17. The electronic package of claim 7 wherein said first electrically conductive means is a lead tin alloy solder.

18. The electronic package of claim 7 wherein said second electrically conductive means is a combination of internal circuit boards and wire bonds.

19. The electronic package of claim 9 wherein some of said metallic pins are electrically interconnected to said base.

20. An electronic package, comprising:
    a metallic base having interior and exterior surfaces and an array of through holes, a dielectric layer coating at least a portion of said metallic base;
    a plurality of metallic terminal pins extending through said holes and terminating approximately at said exterior surface, at least a portion of said metallic terminal pins electrically isolated from said metallic base, said metallic terminal pins adapted to receive solder on the end adjacent said exterior surface;
    a means for electrically interconnecting said metallic terminal pins to an electronic device mounted on said metallic base, said electrically interconnecting means selected from the group consisting of thick films, thin films, internal circuit boards, wire bonds and metallic foils; and
    a cover bonded to said metallic base with said electronic device disposed therebetween.

21. The electronic package of claim 20 wherein said base is an aluminum based alloy and said dielectric layer is a layer of anodized aluminum.

22. The electronic package of claim 21 wherein said means for electrically interconnecting is a combination of internal circuit boards and wire bonds.

23. The electronic package of claim 21 wherein some of said metallic pins are electrically interconnected to said metallic base.

24. An electronic package, comprising:
    a metallic base having a dielectric layer coating at least a portion thereof;
    a cover having interior and exterior surfaces;
    a plurality of metallic terminal pins extending through said cover and terminating approximately at said exterior surface;

a means selected from the group consisting of thick films, thin films, internal circuit boards, wire bonds and metallic foils for electrically interconnecting said metallic terminal pins to an electronic device mounted on said metallic base; and a means to bond said cover to said metallic base.

25. The electronic package of claim 24 wherein both said base and said cover are formed from an aluminum alloy and said dielectric layer is anodized aluminum.

26. The electronic package of claim 25 wherein said means for electrically interconnecting is a combination of internal circuit boards and wire bonds.

27. The electronic package of claim 25 wherein said means for bonding said cover to said base is selected from the group consisting of polymer adhesives and solders.

28. The electronic package of claim 24 wherein said cover is a polymer resin molded about said terminal pins.

* * * * *